(12) United States Patent
Furumura et al.

(10) Patent No.: US 10,428,422 B2
(45) Date of Patent: Oct. 1, 2019

(54) FILM-FORMING METHOD

(71) Applicant: PHILTECH Inc., Tokyo (JP)

(72) Inventors: Yuji Furumura, Kanagawa (JP);
Noriyoshi Shimizu, Tokyo (JP); Shinji Nishihara, Tokyo (JP); Eri Haikata, Tokyo (JP); Masato Ishikawa, Tokyo (JP)

(73) Assignee: PHILTECH Inc., Tokyo (JP)

( * ) Notice: Subject to any disclaimer, the term of this patent is extended or adjusted under 35 U.S.C. 154(b) by 226 days.

(21) Appl. No.: 15/586,488

(22) Filed: May 4, 2017

(65) Prior Publication Data

US 2017/0335454 A1 Nov. 23, 2017

(30) Foreign Application Priority Data

May 17, 2016 (JP) .................................. 2016-099001

(51) Int. Cl.
*C23C 16/455* (2006.01)
*C23C 16/30* (2006.01)
(Continued)

(52) U.S. Cl.
CPC ........ *C23C 16/45527* (2013.01); *C23C 16/30* (2013.01); *C23C 16/403* (2013.01);
(Continued)

(58) Field of Classification Search
CPC . C23C 16/45527; C23C 16/30; C23C 16/403; C23C 16/45523; C23C 16/45557
See application file for complete search history.

(56) References Cited

U.S. PATENT DOCUMENTS

| | | | | |
|---|---|---|---|---|
| 2004/0043149 A1* | 3/2004 | Gordon | ............... | C07F 9/091 |
| | | | | 427/255.31 |
| 2006/0110931 A1 | 5/2006 | Fukazawa et al. | | |
| 2014/0158580 A1* | 6/2014 | Xiao | ................... | C07F 7/10 |
| | | | | 206/524.3 |

FOREIGN PATENT DOCUMENTS

| | | |
|---|---|---|
| JP | H01179710 A | 7/1989 |
| JP | 2000216152 A | 8/2000 |

(Continued)

OTHER PUBLICATIONS

Japanese first Office Action dated Aug. 9, 2018 and its machine translation.
(Continued)

*Primary Examiner* — Kelly M Gambetta
(74) *Attorney, Agent, or Firm* — BainwoodHuang

(57) ABSTRACT

A film-forming method for forming a film in a film-forming apparatus includes generating first gas molecular species and second gas molecular species by causing the first source gas and the second source gas accumulated in the accumulation mechanisms to pass through respective instantaneously-heating units, sharply raising partial pressure of the first gas molecular species and partial pressure of the second gas molecular species by projectingly supplying the first gas molecular species and the second gas molecular species to the reaction chamber in which the substrate has been placed, which has been depressurized, and which has a constant capacity; bringing the first gas molecular species or the second gas molecular species into reaction by alternately repeatedly guiding the first gas molecular species or the second gas molecular species to a surface of the substrate, and forming a compound film on the surface of the substrate.

10 Claims, 6 Drawing Sheets

(51) Int. Cl.
*H01L 31/0216* (2014.01)
*C23C 16/40* (2006.01)
*G02F 1/1333* (2006.01)
*H01L 51/52* (2006.01)

(52) U.S. Cl.
CPC .. *C23C 16/45523* (2013.01); *C23C 16/45557* (2013.01); *H01L 31/02167* (2013.01); *G02F 1/133345* (2013.01); *G02F 2201/501* (2013.01); *H01L 51/5253* (2013.01); *Y02E 10/50* (2013.01)

(56) References Cited

FOREIGN PATENT DOCUMENTS

| JP | 2002154548 A | 5/2002 |
|---|---|---|
| JP | 2003526218 A | 9/2003 |
| JP | 2007046080 A | 2/2007 |
| JP | 2007049128 A | 2/2007 |
| JP | 2010028095 A | 2/2010 |
| JP | 5105620 A | 6/2010 |
| JP | 2013235945 A | 11/2013 |
| JP | 2014059080 A | 4/2014 |
| JP | 2014192379 A | 10/2014 |
| JP | 2015064132 A | 4/2015 |
| JP | 2015096792 A | 5/2015 |
| JP | 2015203120 A | 11/2015 |

OTHER PUBLICATIONS

Korean Notification of Reason for Refusal, dated Aug. 29, 2018 from KIPO, in counterpart Korean Application No. 10-2017-0051012.

Office Action dated Nov. 14, 2017 from Taiwan Patent Office in counterpart Taiwanese application No. 106115213.

* cited by examiner

FILM-FORMING METHOD

TECHNICAL FIELD

The present invention relates to a film-forming method for forming a film in a film-forming apparatus.

BACKGROUND ART

In general, most of chemical bond energies of molecules in a gas are 3 eV or more. Even though the gas is merely heated to a high temperature, the molecules are not decomposed. However, when a gas heated to a high temperature is caused to vertically collide with a metal containing an element having a catalytic effect, the gas molecules change their structures. When chemically reactive gas species are heated and caused to collide with a catalyst, the gas species react to make it possible to generate a gas including molecular species different from those of the original gas or having a form different from that of the original gas (to be referred to as a catalyst collision reaction hereinafter).

For example, when, in a vessel containing a ruthenium catalyst, a gas obtained by instantaneously heating methane and water vapor is caused to collide with the ruthenium catalyst, the reaction proceeds to generate hydrogen $H_2$, carbon dioxide $CO_2$, and carbon monoxide CO. This reaction is one example of a catalyst collision reaction. Although water is heated to be vapored, the temperature does not only simply become high, the structure of the water is considered to be changed from polymers (clusters of water) obtained by polymerizing molecules into monomers. The generated monomer gas is estimated to be changed in chemical characteristic and to have an active chemical characteristic different from that of normal water.

In order to industrially use the catalyst collision reaction, a device for instantaneously heating a gas and a low-price compact heating device for causing a gas to collide with a catalyst are required.

Gas heating devices which satisfy the requests are disclosed in documents (see, for example, PTL 1, PTL 2, PTL 3, PTL 4, and PTL 5). These instantaneously-heating devices are hereinafter called heat beam heating devices (HB) here. This principle of HB heating is to cause a gas to collide with a high-temperature wall at a high speed to efficiently perform heat exchange between the wall and the gas.

For that purpose, the speed of a gas is increased in a narrow gas flow path formed on a surface of a heat exchange substrate, and the gas is caused to vertically collide with a flow path wall. Since this flow path wall is electrically heated, heat exchange is caused by this collision.

A film-forming apparatus is disclosed that heats a plurality of gases with the heat beam heating device and grows, on a glass or plastic substrate kept at a temperature lower than the heating temperature, a material which is not able to be grown without heating the substrate to a high temperature that is equal to or higher than its heatproof temperature (see, for example, PTL 5).

The following are related prior art references:
PTL 1: Japanese Unexamined Patent Application, First Publication No. 2013-235945
PTL 2: Japanese Unexamined Patent Application, First Publication No. 2014-59080
PTL 3: Japanese Unexamined Patent Application, First Publication No. 2015-96792
PTL 4: Japanese Unexamined Patent Application, First Publication No. 2015-64132
PTL 5: Japanese Patent Publication No. 5105620

SUMMARY OF INVENTION

However, the invention of PTL 5 has an issue in which radiant heat disadvantageously deforms plastic or glass because a distance between the substrate and a high-temperature heat exchange component made of carbon is short. For this reason, in order to handle a plastic substrate, an active reactant gas must be chemically produced from a source gas at a lower temperature and guided to the substrate.

Thus, the present invention has been made in consideration of the above issue, and has as its object to provide a film-forming method for forming a compound film by accumulating two types of source gas, instantaneously heating the source gases to generate active gas molecular species, and supplying the molecular species to a surface of a sample of room temperature placed in a reaction chamber that is alternately depressurized so that the partial pressures of the molecular species make projecting peaks.

Embodiment (1): One or more embodiments of the invention provide a film-forming method for forming a film in a film-forming apparatus including: accumulation mechanisms in which a first source gas and a second source gas are accumulated, respectively; instantaneously-heating units that heat the first source gas and the second source gas, respectively; and a reaction chamber in which a substrate whose temperature is lower than a heating temperature of each of the instantaneously-heating units is placed, the method including: generating first gas molecular species and second gas molecular species by causing the first source gas and the second source gas accumulated in the accumulation mechanisms to pass through the instantaneously-heating units, respectively; sharply raising a partial pressure of the first gas molecular species and a partial pressure of the second gas molecular species by projectingly supplying the first gas molecular species and the second gas molecular species to the reaction chamber in which the substrate has been placed, which has been depressurized, and which has a constant capacity; bringing the first gas molecular species or the second gas molecular species into reaction by alternately repeatedly guiding the first gas molecular species or the second gas molecular species to a surface of the substrate; and forming a compound film on the surface of the substrate. The term "accumulation mechanism" here refers to accumulation vessels and mechanism elements, such as valves, that are provided at the inlets and outlets of the accumulation vessels to control the flow rates of source gases or gas molecular species or elements that electronically control the flow rates. The term "projectingly" here refers to short-time partial-pressure peaking, defining a change in partial pressure by the ratio between the volume of a gas in an accumulation vessel at a pressure of one atmosphere and the capacity of a depressurized reaction chamber.

Embodiment (2): One or more embodiments of the invention provide a film-forming method wherein the first source gas contains at least one of elements including silicon, aluminum, gallium, titanium, zinc, and indium, and the second source gas is water, an aqueous solution, or ammonia.

Embodiment (3): One or more embodiments of the invention provide a film-forming method wherein the partial pressure of the first gas molecular species or the second gas molecular species is raised by blocking off exhaust or reducing an exhaust velocity in synchronization with a period during which the first source gas or the second source gas is projected to sharply rise in partial pressure.

Embodiment (4): One or more embodiments of the invention provide a film-forming method wherein a surface of a flow path of each of the instantaneously-heating units is made of a metal containing at least one of elements including ruthenium, nickel, platinum, iron, chromium, aluminum, and tantalum.

Embodiment (5): One or more embodiments of the invention provide a film-forming method wherein the heating temperature of each of the instantaneously-heating units ranges from room temperature to 700° C.

Embodiment (6): One or more embodiments of the invention provide a film-forming method wherein the substrate is a film substrate and moves within the reaction chamber.

Embodiment (7): One or more embodiments of the invention provide a film-forming method wherein a plurality of the substrates are provided in the reaction chamber.

Embodiment (8): One or more embodiments of the invention provide a film-forming method wherein the substrate is a silicon wafer.

Embodiment (9): One or more embodiments of the invention provide a film-forming method wherein the substrate is a plastic container.

Embodiment (10): One or more embodiments of the invention provide a film-forming method wherein the substrate is a device substrate on which an organic EL device, a liquid crystal device, a solar cell, or a structure pattern has been formed.

Advantageous Effects of Invention

In forming a film of a high-temperature material by introducing source gases into gas instantaneously-heating devices, instantaneously heating gases to generate desired generated gas molecular species, guiding the generated gas molecular species to a surface of a substrate held in a low-temperature reaction chamber, one or more embodiments of the present invention bring about an effect of facilitating the adsorption of the generated gases onto the surface of the substrate by projectingly supplying the generated gases, accumulated under higher pressure, to expand and cool the generated gases and raising the partial pressures of the generated gases in the reaction chamber.

The cooled high-partial-pressure molecular species are densely adsorbed, and the adsorbed molecular species bind with each other on the surface to effect pseudo-liquefaction that makes the surface wet. When the molecular species are adsorbed to such an extent as to make the surface wet, a film having a uniformly smooth surface can be formed. An increase in adsorption density leads to an increase in thickness of a film that can be grown per occurrence of adsorption. This brings about an effect of achieving a growth rate that is higher than that of simple ALD (i.e. a method called atomic layer deposition).

DETAILED DESCRIPTION

An embodiment of the present invention is described below with reference to FIGS. 1 to 6.
<Embodiment>
A film of a high-temperature material can be formed even at room temperature when active molecular species generated by instantaneously heating two types of source gas are alternately guided to a substrate repeatedly. At that time, a high-density adsorption layer is produced by causing the substrate to adsorb a larger amount of active molecular species. The densely-adsorbed reactive layer of two types of active molecular species reacts to give a film of a compound. At this time, the high-density adsorption results in a growth rate that is higher than that of simple atomic layer deposition. This is the essence and feature of the present embodiment.

Figure 1:
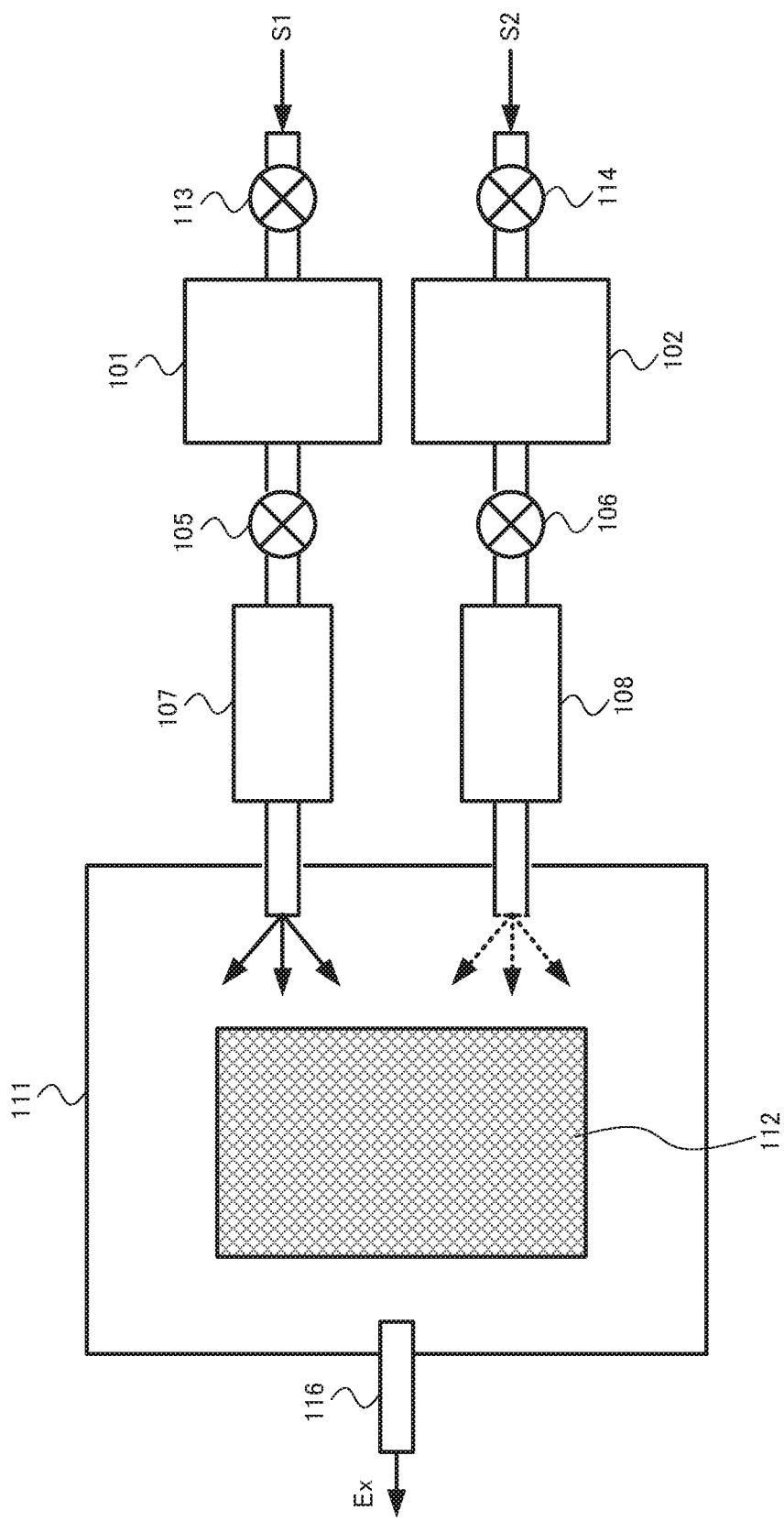
FIG. 1 is a diagram schematically showing a configuration of an apparatus that is used in a film-forming method according to an embodiment of the present invention.

As shown in FIG. 1, an apparatus that is used in a film-forming method according to the present embodiment includes valves 113, 114, 105, and 106, source gas accumulation vessels 101 and 102, instantaneously-heating units 107 and 108, a reaction chamber 111, a substrate 112, and an exhaust pipe 116.

In the following, the film-forming method according to the present embodiment is concretely described with the use of a source gas S1 and a source gas S2 as reactive source gases.

The source gas S1 is a source gas obtained by bubbling trimethylaluminum (abbreviated as "TMA") with a carrier gas. The source gas S1 is accumulated in the source gas accumulation vessel 1 (101) through the valve V3 (113) in a constant volume controlled under a source gas pressure P1. The source gas S2 is a source gas obtained by bubbling water with a carrier gas. The source gas S2 is accumulated in the source gas accumulation vessel 2 (102) through the valve V4 (114) in a constant volume controlled under a source gas pressure P2 (104).

The source gas S1 and the source gas S2 are accumulated in constant volumes under the respective pressures in the source gas accumulation vessel 1 (101) and the source gas accumulation vessel 2 (102). The source gas accumulation vessel 1 (101) and the source gas accumulation vessel 2 (102) are connected to the HB gas heating unit 1 (107) and the HB gas heating unit 2 (108), which are source gas instantaneously-heating units, via the valve V1 (105) and the valve V2 (106), respectively. A control unit (not illustrated) turns on and off (opens and shuts) the valve V1 (105) and the valve V2 (106) in accordance with a program configuration. It should be noted that since the HB gas heating units are technologies disclosed in PTL 1 to PTL 5, they are not described in detail here.

The valve V1 (105) is turned on (opened) to start ejecting the accumulated amount of source gas (TMA gas) S1. The source gas (TMA gas) S1 thus ejected is instantaneously heated by the HB gas heating unit 1 (107) and projectingly supplied to the reaction chamber 111 as a HB generated gas 1 of monomers of TMA. At this time, since the reaction chamber with a constant capacity has been depressurized, the gas introduced under high pressure expands, and rises in partial pressure. Then, this expansion causes the HB generated gas 1 to be cooled.

Next, the valve V2 (106) is turned on (opened). The accumulated amount of source gas S2 of water is ejected, instantaneously heated by the HB gas heating unit 2 (108), and projectingly supplied to the reaction chamber 111 as a HB generated gas 2 of monomers of water. At this time, since the reaction chamber with a constant capacity has been depressurized, the gas introduced under high pressure expands and gets cooled. Then, the HB generated gas 2 of monomers of water rises in partial pressure. Then, this expansion causes the HB generated gas 2 to be cooled.

The valve V1 and the valve V2 are alternately turned on and off so that a cycle of projectingly supplying the source gas S1 and the source gas S2 is repeated. This causes the molecular species of monomers of TMA and water to be expandingly supplied to a surface of the substrate 112, be cooled, alternately rise in partial pressure, and be adsorbed onto the surface of the substrate 112. Repetition of this alternate adsorption causes an aluminum oxide film to grow. In introducing the source gas S1 and the source gas S2, it is alternatively possible to separately prepare a carrier gas, cause the source gas S1 and the source gas S2 to merge with the carrier gas, and projectingly supply the source gas S1 and the source gas S2 to the reaction chamber 111.

Rather than alternate introduction of the source gases under always constant reduced-pressure condition, the source gas S1 and the source gas S2, accumulated by being intentionally pressurized, should be instantaneously projected at once and supplied to the reaction chamber. This causes the molecular species to be instantaneously adsorbed at high partial pressures, thus achieving an increase in surface adsorption density. A certain or higher level of increase in surface adsorption density effects liquefaction on the surface to make the surface smoothly wet. Because of this, the formation of a film having a flat and smooth surface is expected. Even in the presence of particles of foreign matter such as dust, a surface adsorption layer is formed to cover the foreign matter and the surface, making those particles wet and containing them inside. This makes it possible to, even in the presence of foreign matter, form a smoothly-surfaced film that contains the foreign matter. The supply of the molecular species with repeated depressurization and projecting supply causes the HB generated gases to be transported and cover spaces that become deep holes or shadowed areas. This provides the capability to form a film on an inner side of a combined structure such as a screw.

Figure 2:
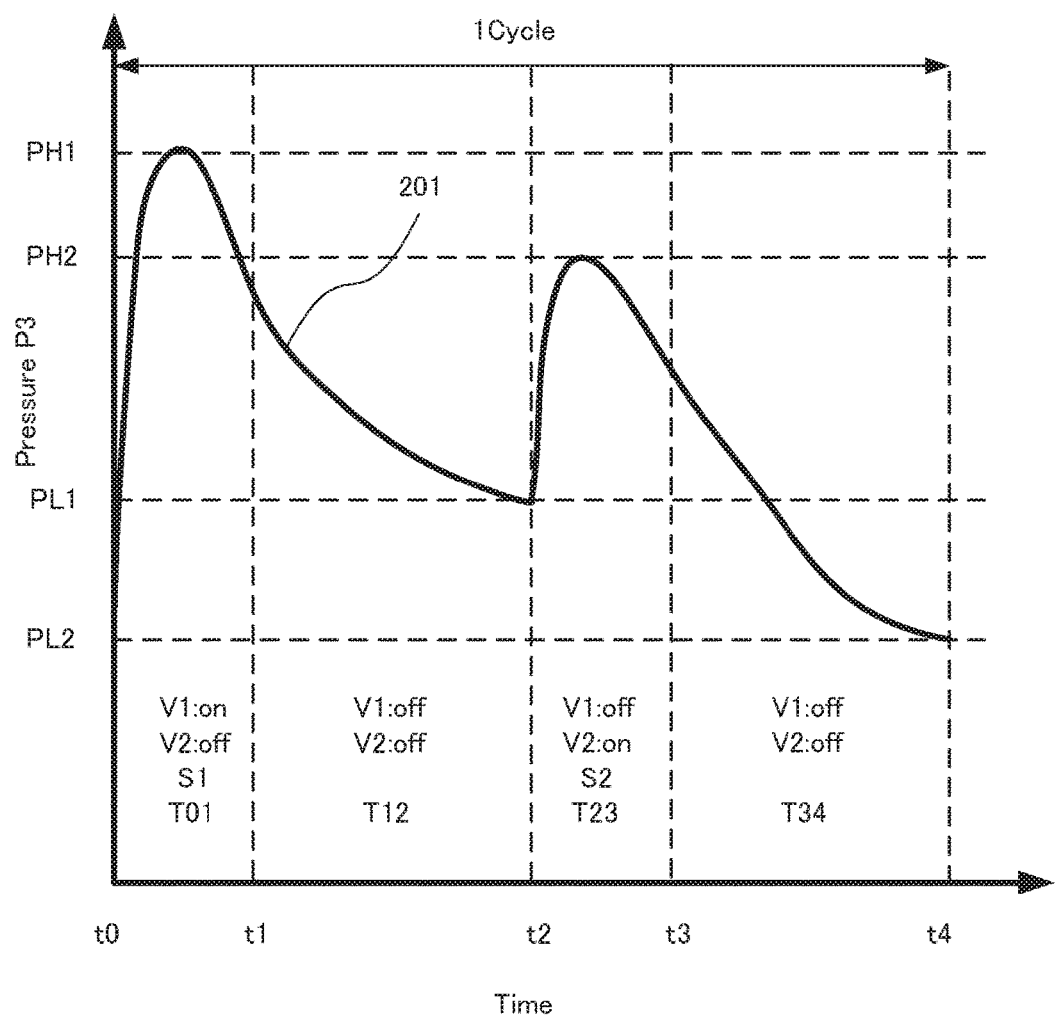
FIG. 2 is a diagram showing a time table of projecting partial-pressure modulation that is used in the film-forming method according to the embodiment of the present invention.

FIG. 2 schematically shows a 1-cycle program of gas introduction described above. At t0, the valve V1 (105) is turned on (opened) to projectingly supply the HB generated gas 1 of the source gas S1 to the reaction chamber 111. A pressure P3 of the reaction chamber 111 instantaneously rises to reach a pressure peak PH1. At t1, the valve 1 (105) is turned off (shut) to stop the supply of the source gas S1. Since, at this time, the valve V2 (106) is also off (shut), the pressure continues being reduced, so that the gas remaining in the reaction chamber 111 is purged. This purging may be performed by a carrier gas (not illustrated) or by exhaust alone.

At t2, the pressure of the reaction chamber 111 becomes PL1. At t2, the valve V2 (106) is turned on to projectingly supply the HB generated gas 2 of the source gas S2 to the reaction chamber 111. The pressure P3 of the reaction chamber 111 instantaneously rises to reach a pressure peak PH2. At t3, the valve V2 (106) is turned off (shut) to stop the supply of the source gas S2. Since, at this time, the valve V1 (105) is also off, the pressure continues being reduced. At t4, the gas in the reaction chamber 111 is purged, so that the pressure becomes PL2. This purging may be performed by a carrier gas (not illustrated) or by exhaust alone.

Note here that PH1, PH2, PL1, and PL2 are illustrated by different values, as the supply volumes of the source gases, the carrier gas flow rate, and the reaction chamber capacity vary according to the exhaust velocity. It should be noted that it is possible to adjust PH1, PH2, PL1, and PL2 so that they take on the same value. Further, the curve of pressure change schematically shows one example. The curve of pressure change varies according to container structures that constitute as source gas accumulation mechanism and the thickness and length of gas-introducing pipes and the settings of the source gas pressures P1 and P2. Further, for repetition of the aforementioned cycle, the source gas accumulation vessels 1 and 2 (107 and 108) are replenished with source gases for the subsequent cycle through the valve V3 (113) and the valve V4 (114). Conditions for the replenishments, such as pressures, amounts, and timings, can be freely designed by a program.

The source gas S1 contains at least one of elements including silicon, aluminum, gallium, titanium, zinc, and indium. The source gas S2 is water, an aqueous solution, or ammonia.

It should be noted that the source material S1 may be an organic compound gas of a metal or a gas of a halide. Trimethylaluminum, which is an organic compound of aluminum, is a liquid at normal room temperature.

A material that is a liquid at normal room temperature is turned into a source gas by being bubbled with a carrier gas or turned into a source gas by raising the temperature. Organic gases of silicon, gallium, titanium, zinc, and indium are also liquids and, as such, are turned into source gases by bubbling or heating. Water can be turned into a monomolecular gas called superheated steam when heat to at lowest 150° C. The accumulation vessel is heated as needed so that liquefaction of the source gas does not occur in the accumulation vessel.

The monomolecular water is small in molecule and strong in osmotic action. Further, since the monomolecular water is polarized, it is considered to be densely adsorbed and exhibit strong oxidizing action. An aqueous solution of a chemical can also be used as a source gas. An aqueous solution of hydrogen fluoride or formic acid is a material that can introduce the components of a chemical as well as monomolecular water.

The partial pressure of first gas molecular species or second gas molecular species is raised by blocking off the exhaust or reducing the exhaust velocity in synchronization with a period during which the source gas S1 or the source gas S2 is projected to sharply rise in partial pressure. Since the effect of projecting the partial pressures is brought about simply by keeping the exhaust velocity low, the exhaust pipe 116 may be designed to be fixed and narrow. Alternatively, it is possible to prepare and switch between two types of exhaust pipe 116. The exhaust velocity can also be controlled by controlling the number of revolutions of an exhaust pump. The molecular species partial pressures can also be controlled by providing the exhaust pipe 116 with an exhaust baffle plate and thereby performing conductance control. With an accumulation mechanism that uses a mass flow controller to dynamically control the supply amounts of the source gas S1 and the source gas S2 under a program, projecting supply modulation in partial pressure of the molecular species are also possible with a structure and control design without the source gas accumulation vessels 101 and 102.

A surface of a flow path of each of the instantaneously-heating units 107 and 108 is made of a metal containing at least one of elements including ruthenium, nickel, platinum, iron, chromium, aluminum, and tantalum.

The heating temperature of each of the instantaneously-heating units ranges from room temperature to 700° C. Water generates molecular species of superheated steam at a heating temperature of 150° C. or higher. Ammonia releases hydrogen at 550° C. or higher and generates active molecular species of a compound of hydrogen and nitrogen. Therefore, the temperature of each of the instantaneously-heating units 107 and 108 needs only be selected from the range of room temperature to 700° C. A temperature of 900° C. or higher is not appropriate from a practical standpoint, because when the instantaneously-heating units 107 and 108 are made of stainless steel, their surfaces react with hydrogen, water, or an ammonia source gas at a temperature of 900° C. or higher to become unable to maintain their material textures for a long period of time.

Figure 3:
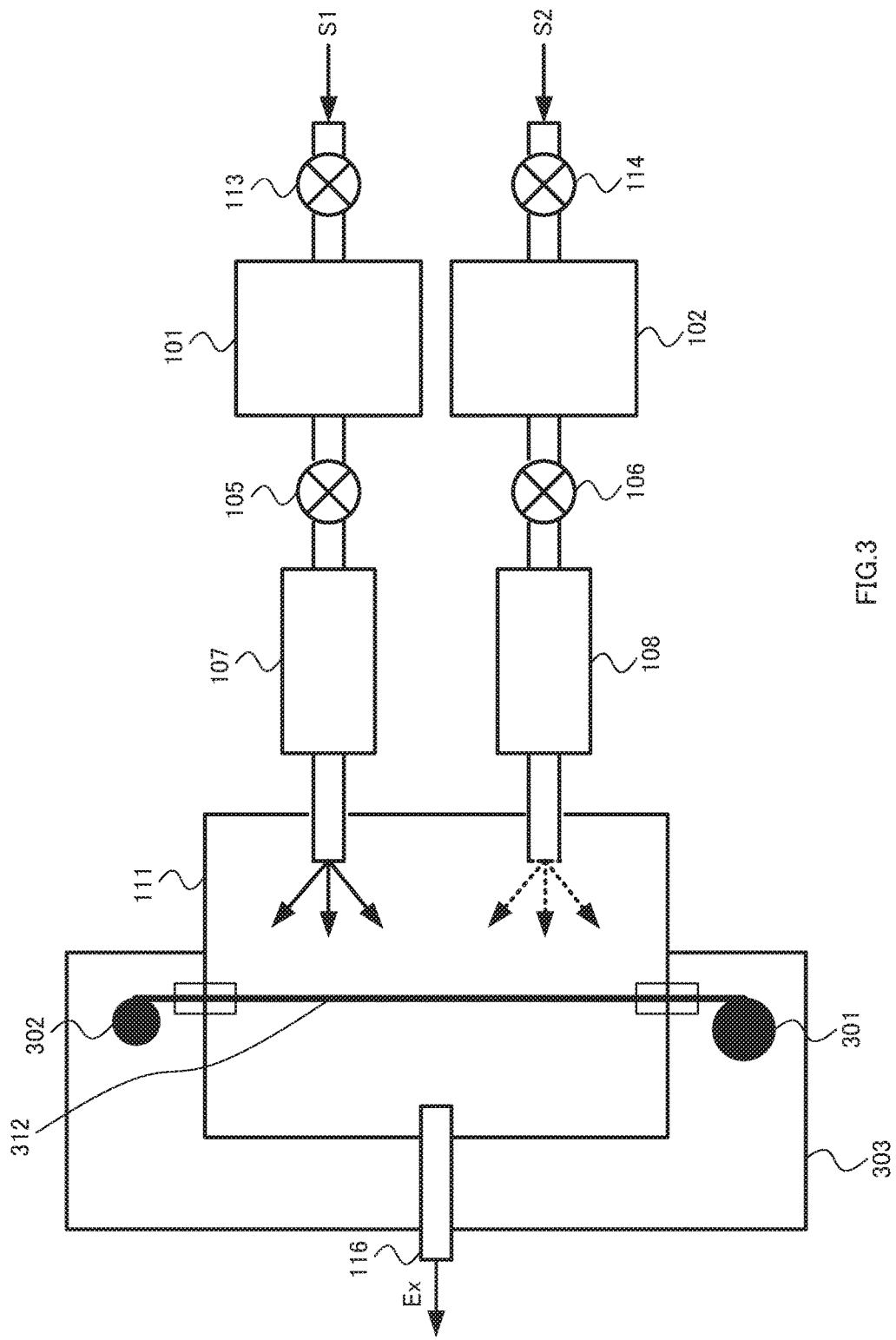
FIG. 3 is a diagram schematically showing a configuration of the apparatus in a case of supplying a substrate in the form of a roll in the film-forming method according to the embodiment of the present invention.

Such a form of a modification is possible in which the substrate 112 is a film substrate and moves within the reaction chamber 111. FIG. 3 shows an overview of the apparatus in a case where the substrate 112 is a film substrate. A film substrate 312 is supplied from a supply roller 301, moves within the reaction chamber 111, and is collected by being wound around a collect roller 302. Note here that the film substrate 312 may be a plastic or PET film.

Figure 4:
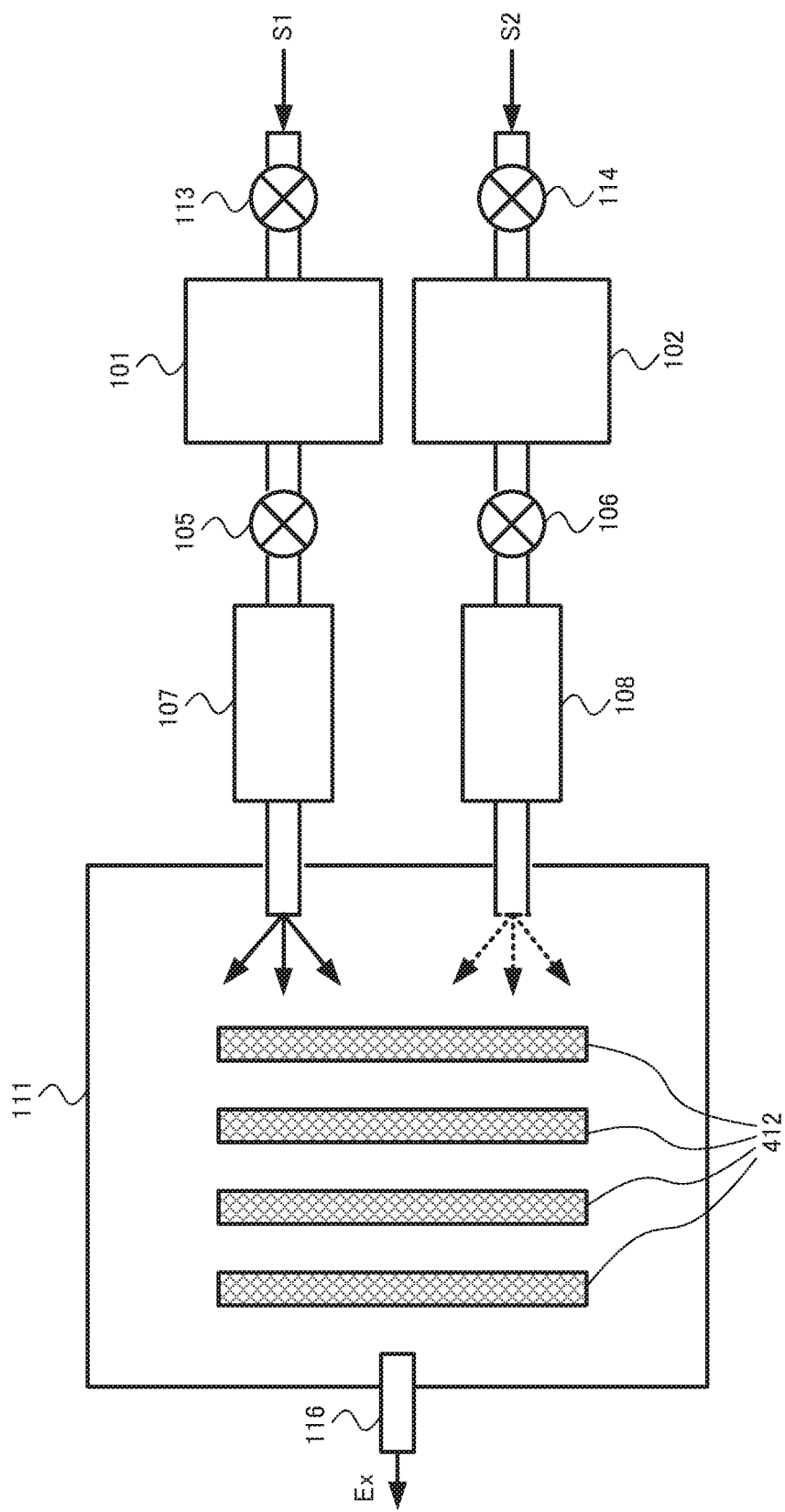
FIG. 4 is a diagram schematically showing a configuration of the apparatus in a case of forming films on a plurality of substrates using the film-forming method according to the embodiment of the present invention.

As shown in FIG. 4, there may be a plurality of substrates 112. In this case, the HB generated gases 1 and 2 projectingly supplied to the reaction chamber 111 sneak around a plurality of substrates 112 onto a substrate 112 placed behind the plurality of substrates 112 and form a film substantially in the same manner as in the case where there is only a single substrate 112.

The substrates 112 may be a silicon wafer or a plastic container. Further, the reaction chamber 111 itself may be a vessel serving as a substrate. Furthermore, the substrate 112 may be a device substrate on which an organic EL device, a liquid crystal device, a solar cell, or a structure pattern has been formed. These devices deteriorate due to oxidization and moisture absorption. In order to prevent this deterioration, it is necessary to cover these devices with a film substrate obtained by growing a film that does not allow permeation of oxygen or water. However, the film substrate does not have heat resistance. Therefore, for example, an alumina film that does not allow permeation of water just should be grown by the present method, which enables film growth at room temperature.

Thus, as described above, the present embodiment makes it possible to achieve high partial pressures of active molecular species in the reaction chamber. For that purpose, the source gases are accumulated under a pressure of one atmosphere in the vessels. The source gases are instantaneously heated by causing them to pass through the HB gas heating units, turned into active chemical molecular species, and projectingly supplied to the depressurized reaction chamber. The projectingly-supplied molecular species expand to become lower in temperature, and the partial pressures of the molecular species sharply rise in the reaction chamber, so that the molecular species are densely adsorbed onto the surface of the substrate placed at room temperature. By being densely adsorbed, the molecular species bind with each other to make the surface wet. Since the number of adsorbed molecules is larger than an amount that is attained by monomolecular adsorption, a growth rate that is higher than that of ALD (atomic layer deposition) can be expected.

Further, various types of compound film can be designed. Organic gases of silicon, aluminum, gallium, titanium, zinc, and indium are materials that are industrially supplied. Combining these metals with oxygen or nitrogen makes it possible to form films of oxides or nitrides of these metals. Ammonia starts its decomposition by releasing hydrogen at 550° C. or higher. Ammonia is heated by the HB gas heating unit and collision with a catalytic metal causes the decomposition to occur at a lower temperature. This makes it possible to form a film of a nitride by bringing molecular species containing the above mentioned metal into reaction with active molecular species of ammonia. Further, water is a polymer in itself at 100° C. However, superheated steam heated to 150° C. or higher by the HB heating unit becomes active molecular species containing a monomeric component. This makes it possible to form a film of an oxide of the metal. These are examples of combinations of elements. The formation of a film of a compound can be designed by a combination of the temperatures of the gas instantaneously-heating units and the source gas elements.

Further, the molecular species partial pressures are easily raised. The exhaust velocity can be sufficiently reduced simply by designing the exhaust pipe to be narrow. It is possible to prepare and switch between two types of exhaust pipes, namely a thick exhaust pipe and a narrow exhaust pipe. Since the exhaust velocity can also be controlled by controlling the number of revolutions of the exhaust pump, measures can be taken by a program in timing. Alternatively, the molecular species partial pressures can also be controlled by providing the exhaust pipe with an exhaust baffle plate and thereby performing conductance control.

Further, it is possible to select the metal of which the surface of the flow path of each of the source gas instantaneously-heating units is made. By making the surface of ruthenium, nickel, platinum, or the like, which causes catalysis in the decomposition of a gas, or by placing any of these metals in the flow path and causing it to collide with the gas, the source gas can be decomposed at a lower temperature to generate active molecular species. In some temperature ranges, aluminum or tantalum serves as a corrosion-inhibiting material. Corrosion-resistant stainless steel can be used, as iron, chromium, and nickel are main components of stainless steel.

Further, the heating temperature of each of the source gas instantaneously-heating units can be selected from the range of room temperature to 700° C. A temperature of 150° C. or higher is effective when superheated steam is made from water. Since it is over 600° C. or so that it becomes possible to decompose a hydrocarbon that generates hydrogen, a hydrocarbon can be used as a source gas to generate molecular species and a film that can be formed from the molecular species can be designed.

Further, a long film substrate may be enabled to continuously move relative to the reaction chamber in which the substrate is in contact with the generated gases. Since the film is bendable, the film can move in a zigzag pattern within the reaction chamber. The film is typified by polyethylene terephthalate (PET). When a film of a high-temperature material such as alumina or a silicon nitride can be formed on a device film that resists heat of 100° C. or lower, this film covers the device film on which a device has been formed and can serve as a barrier film that prevents permeation of moisture. The barrier film has an effect of enhancing the reliability of the device. When devices are formed on a continuous film, a barrier film can be continuously grown. In general, the high-temperature material is ceramic and therefore hard. A hard film that does not damage a surface of a film can be grown.

Further, a large number of substrates can be handled. The substrates may be small-sized wafers, vessels, chips, or printed boards. Furthermore, a film can also be effectively formed on a surface of a particle substrate composed of plastic particles, glass particles, chemical particles, or the like. Sizes can vary from the millimeter to the nanometer. By alternately supplying reactive molecular species under projecting partial pressure into a tube filled with such a particle substrate, a film can be formed on each particle.

Further, a film can be formed on a silicon wafer on which a material whose temperature cannot be raised has been stacked. In some cases, a microstructure may be formed by a photoresist material on a silicon wafer. Alternatively, a material limited in temperature may be formed. When it is necessary to form a film on a substrate of a silicon wafer of such a material structure, the present film-forming method can attain the object, as the present film-forming method enables growth at room temperature.

Further, there is a demand that a silicon substrate provided with a flow path fabricated by a photoresist be utilized in a component analysis of a liquid containing blood or cells. At a time like this, forming an alumina film on the resist gives a chemically stable flow path. The present invention has an effect of meeting such a demand for growth at room temperature.

Further, a silicon dioxide film of a mask material having dry etch resistance or the like may be formed on a photoresist pattern, but this step is expensive, as this step involves the use of a method called plasma CVD. The present invention can achieve an inexpensive step, as the present invention is directed to a film-forming method based on heat alone without the use of plasma treatment.

Further, a film can be made on a plastic container. A plastic container is low in price and weight and, as such, is suitable to keep foods or chemicals in. Such a container needs the function of protecting the contents from invasion by moisture or oxygen contained in the outside air. Further, such a container also needs the function of preventing components of the contents from diffusing into the outside air. A container coated, for example, with a film of aluminum oxide by the present film-forming method can fulfill these functions. The present film-forming method, which projectingly modulates the partial pressures of molecular species and causes the molecule species to be densely adsorbed to the inside of a large number of container substrates, makes it possible to form films on the larger number of container substrates at a time and therefore enables inexpensive fabrication.

Furthermore, a film can be formed on a device substrate on which an organic EL device, a liquid crystal device, or a solar cell has been formed. Display devices typified by organic EL deteriorate due to oxidization and moisture absorption. This poses an impediment to practical use with guaranteed operating lives. Therefore, there has been an issue in which, with a larger-area substrate kept at a low temperature, a protective thin film of a moisture-resistant material cannot be formed on a surface of a substrate on which a device has been formed. Currently, vacuum sputtering of a silicon oxide film is the only method. However, this method incurs high manufacturing costs. This hinders practical use of large-sized organic EL displays. Further, ensuring long-term reliability of solar cells pushes manufacturing costs higher. The present embodiment brings about an effect of making it possible to address these issues.

EXAMPLE 1

An example in which a film of aluminum oxide is grown as a film of a compound on a surface of a substrate is described below with reference to FIG. 1.

In Example 1, a mixed gas of trimethylaluminum (TMA) bubbled with argon and an argon carrier was used as the source gas S1. A mixed gas of water bubbled with argon and an argon carrier was used as the source gas S2.

A supply program was given to cause the source gas S1 and the source gas S2 to be supplied into the reaction chamber in time frames that did not overlap each other. The source gases were accumulated in the source gas accumulation vessels 1 and 2 (101 and 102) by opening the valve V3 (113) and the valve V4 (114), respectively. The source gas pressure P1 and the source gas pressure P2 in the vessels were each set to a pressure of one atmosphere. Each of source gas accumulation vessels 1 and 2 had a capacity of approximately 30 cc.

The source gas accumulation vessels 1 and 2 (101 and 102) were connected to the HB gas heating unit 1 (107) and the HB gas heating unit 2 (108), which are source gas heating devices, via the valve V1 (105) and the valve V2 (106), respectively. Note here that the HB gas heating units 1 and 2 (107 and 108) were set to a heating temperature of 160° C.

At the timing of the time t0 shown in FIG. 2, the valve V1 was turned on (opened). The source gas S1 (TMA gas) was ejected in the amount accumulated in the source gas accumulation vessel 1 (101). The source gas S1 was instantaneously heated by the HB gas heating unit 1 (107). The HB generated gas 1 of monomers of TMA was projectingly supplied to the reaction chamber 111.

Balance with exhaust Ex causes the reaction chamber 111 to be depressurized by a pressure of 0.01 atmosphere. Therefore, the gas accumulated under a pressure of one atmosphere in the source gas accumulation vessel 1 (101) was projectingly supplied to expand with a sharp rise in partial pressure. This expansion caused the HB generated gas 1 to be cooled. The reaction chamber 111 had a capacity of 800 cc. Assuming that the ratio of the capacity of the reaction chamber 111 to the supply volume of 30 cc of the source gas at a pressure of one atmosphere is defined as a partial-pressure change index, the partial-pressure change index is approximately 0.038. This index is an index that expresses the characteristics of changing partial pressures of the present technique.

The time interval T01 between the time t0 and the time t1 was 1 second. At the timing of time t1, the valve V1 (105) and the valve V2 (106) were both closed, whereby the reaction chamber 111 was depressurized. This state lasted until the time t2. The time interval between the time t1 and the time t2 was 9 seconds.

At the timing of the time t2, the valve V2 (106) was turned on. The source gas S2, which was composed of water, was ejected and flowed out in the amount accumulated in the source gas accumulation vessel 2 (102). The source gas S2 was instantaneously heated by the HB gas heating unit 2 (108). The HB generated gas 2 of monomers of water was projectingly supplied to the reaction chamber 111. Since the reaction chamber 111 had been depressurized, the HB generated gas introduced under high pressure sharply expanded. This expansion caused the HB generated gas 2 to be cooled.

The period of time during which the valve V2 (106) was on lasted from the time t2 until the time t3, and the time interval T23 between the time t2 and the time t3 was 1 second. The reaction chamber 111 had a capacity of 800 cc. Since the supply volume 30 cc of the source gas S2 at a pressure of one atmosphere was the same as that of the source gas S1, the partial-pressure change index was 0.038.

At the timing of the time t3, the valve V1 (105) and the valve V2 (106) were both closed, and the reaction chamber 111 continued being depressurized until the time t4. The time interval T34 between the time t3 and the time t4 was 9 seconds.

The source gas accumulation vessel 1(101) was replenished with source gas S1 in the period of time during which the valve V1 (105) was closed. The source gas accumulation vessel 2(102) was replenished with source gas S2 in the period of time during which the valve V2 (106) was closed.

While the source gas accumulation vessels 1 and 2 (101 and 102) were being replenished with the source gases, a cycle of projectingly supplying the HB generated gases to the reaction chamber 111 was repeated by turning on and off the valve V1 (105) and the valve V2 (106) in accordance with the time table shown in FIG. 2. The duration of one cycle was 1 second+9 seconds+1 second+9 seconds=20 seconds. This cycle was repeated 75 times. A cross-section TEM observation demonstrated that an aluminum oxide film of approximately 100 nm was grown in 75 cycles, i.e. 25 minutes.

Figure 5:
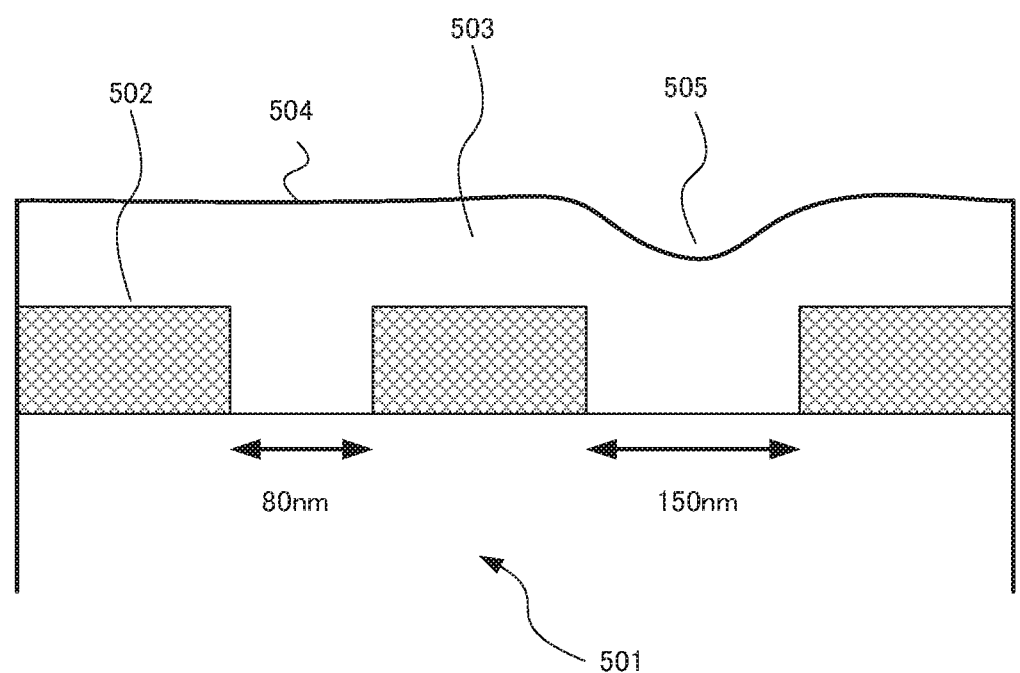
FIG. 5 is a schematic view showing an embedding characteristic of an alumina film formed using the film-forming method according to the embodiment of the present invention.

As the substrate 112, a silicon wafer 501 on which a hole pattern of a resist had been fabricated was placed. A cross-section SEM image (electron microscopic image) of the silicon wafer 501 was observed. FIG. 5 is a schematic view of the cross-section SEM image. A surface 1 (504) of a hole having a diameter of 80 nm was flat. A surface 2 (505) of a hole having a diameter of 150 nm was smoothly depressed.

This shape is different from that which is obtained by ordinary CVD. The cross-section was shaped as if a liquid had been solidified. This shape implies a physical phenomenon in which the monomers of TMA or water were adsorbed in liquid form and grown, although this is a mere conjecture as measurements or in-situ observations cannot be performed. The molecular species are considered to have been densely adsorbed to effect liquefaction on the surface.

EXAMPLE 2

With the growth conditions being the same as those of Example 1, a polyethylene terephthalate (PET) film was placed as the substrate 112. The formed film and the PET film, i.e. the substrate, were stacked to form a laminate structure. A helium (He) permeation test was conducted on this laminate structure. The permeation test was conducted by a method in which one side of the film was filled with He at a pressure of one atmosphere and the partial pressure of He leaking out to the opposite side was measured by a quadrupole mass spectrometer.

In the case of a single PET film on which this film of aluminum oxide was not formed, He permeated in approximately 2 minutes. However, in the case of the PET film structure in which this aluminum oxide had been stacked, He did not permeate even with passage of 10 minutes, as in the case of a 1-mm-thick glass plate. This demonstrated the presence of the property of preventing permeation of water, carbon dioxide, oxygen, which are larger in molecular size than He. Further, an analysis of elution of aluminum was conducted by immersing this laminate-structured film in 50° C. water and letting it stand for a day, and no elution was confirmed. This implies that the composition of this aluminum oxide is stoichiometric.

EXAMPLE 3

With the reaction chamber 111 having a capacity of 50 L, a film was formed under the same gas supply conditions as those of Example 1. The partial-pressure change index was calculated to be 0.0006.

Figure 6:
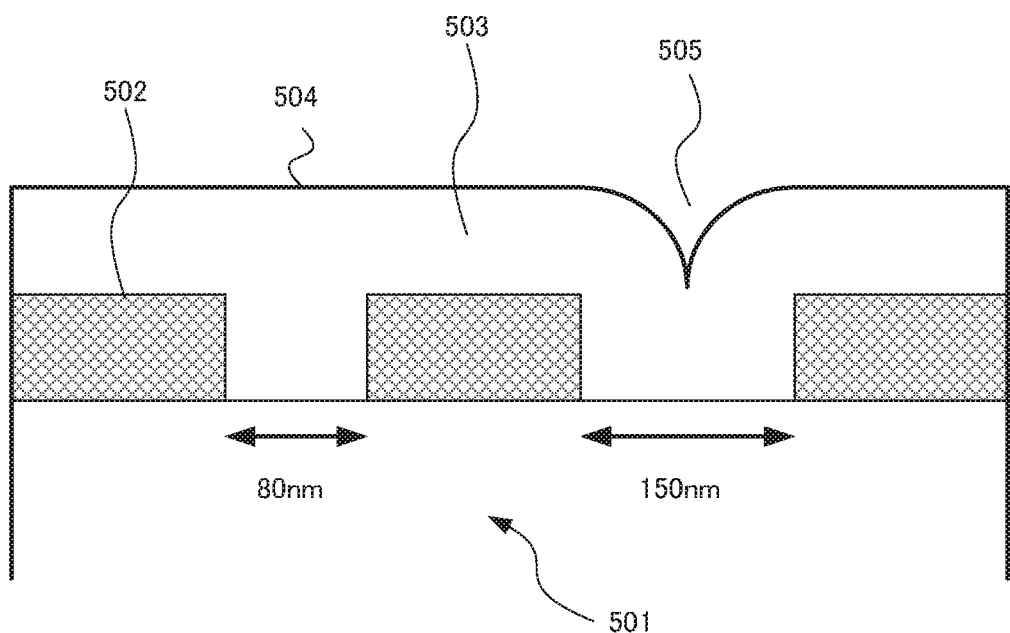
FIG. 6 is a schematic view showing an embedding characteristic of an alumina film formed using the film-forming method according to the embodiment of the present invention.

As the substrate 112, a silicon wafer 501 on which a hole pattern of a resist had been fabricated was placed. A cross-section SEM image (electron microscopic image) of the silicon wafer 501 was observed. A surface of a hole having a diameter of 80 nm was flat, as in the case of Example 1. However, a surface of a hole having a diameter of 150 nm was such that, as shown in FIG. 6, the film was (conformally) grown in conformance with the wall of the hole, unlike in the case of Example 1. The partial-pressure change index serves as an index that represents the characteristics of differences in growth conditions.

A comparison between Example 1 and Example 3 shows that the condition in which the partial-pressure change index 0.038 can be evaluated to be more effective in making a flat and smooth surface than the case where the partial-pressure change index is 0.0006.

The embodiment of the present invention has been described in detail with reference to the accompanying drawings. However, the concrete configuration of the invention is not limited to the embodiment, and includes a design or the like without departing from the spirit and scope of the invention.

REFERENCE SIGNS LIST

101: source gas accumulation vessel 1
102: source gas accumulation vessel 2
105: valve V1
106: valve V2
107: instantaneously-heating unit 1 (HB gas heating unit 1)
108: instantaneously-heating unit 2 (HB gas heating unit 2)
111: reaction chamber
112: substrate
113: valve V3
114: valve V4
116: exhaust pipe
201: pressure curve
301: supply roller
302: collect roller
303: roller chamber
312: film substrate
412: plurality of substrates
501: silicon wafer substrate
502: resist
503: alumna film
504: surface 1
505: surface 2

What is claimed is:

1. A film-forming method for forming a film in a film-forming apparatus including (i) a first accumulation mechanism in which a first source gas is accumulated and a second accumulation mechanism in which a second source gas is accumulated, (ii) a first instantaneously-heating unit connected to the first accumulation mechanism that heats the first source gas, and a second instantaneously-heating unit connected to the second accumulation mechanism that heats the second source gas, wherein each of the first and second instantaneously-heating units heats each of the first and second source gases respectively by causing each of the first and second source gases to vertically collide with a flow path wall of a flow path formed on a surface of a heat exchange substrate electrically heated to cause heat exchange between each of the first and second source gases and the flow path wall, and (iii) a reaction chamber in which a substrate whose temperature is lower than a heating temperature of each of the first and second instantaneously-heating units is placed, comprising:

generating first gas molecular species by causing the first source gas in an amount accumulated in the first accumulation mechanism to pass through the first instantaneously-heating unit, and generating second gas molecular species by causing the second source gas in an amount accumulated in the second accumulation mechanism to pass through the second instantaneously-heating unit;

sharply raising a partial pressure of the first gas molecular species and a partial pressure of the second gas molecular species by projectingly supplying the first gas molecular species and the second gas molecular species so that the partial pressures of the first and second gas molecular species make projecting peaks to the reaction chamber in which the substrate has been placed, which has been depressurized, and which has a constant capacity;

bringing the first gas molecular species or the second gas molecular species into reaction by alternately repeatedly guiding the first gas molecular species or the second gas molecular species to a surface of the substrate; and forming a compound film on the surface of the substrate by supplying the first and second gas molecular species with repeated depressurization and projecting supply.

2. The film-forming method according to claim 1, wherein the first source gas contains at least one of elements including silicon, aluminum, gallium, titanium, zinc, and indium, and the second source gas is water, an aqueous solution, or ammonia.

3. The film-forming method according to claim 1, wherein the partial pressure of the first gas molecular species or the second gas molecular species is raised by blocking off exhaust or reducing an exhaust velocity in synchronization with a period during which the first source gas or the second source gas is projected to sharply rise in partial pressure.

4. The film-forming method according to claim 1, wherein a surface of the flow path of each of the first and second instantaneously-heating units is made of a metal containing at least one of elements including ruthenium, nickel, platinum, iron, chromium, aluminum, and tantalum.

5. The film-forming method according to claim 1, wherein the heating temperature of each of the first and second instantaneously-heating units ranges from room temperature to 700° C.

6. The film-forming method according to claim 1, wherein the substrate is a film substrate and moves within the reaction chamber.

7. The film-forming method according to claim 1, wherein a plurality of the substrates are provided in the reaction chamber.

8. The film-forming method according to claim 1, wherein the substrate is a silicon wafer.

9. The film-forming method according to claim 1, wherein the substrate is a plastic container.

10. The film-forming method according to claim 1, wherein the substrate is a device substrate on which an organic EL device, a liquid crystal device, a solar cell, or a structure pattern has been formed.

* * * * *